United States Patent
Minegishi et al.

(10) Patent No.: US 8,109,296 B2
(45) Date of Patent: Feb. 7, 2012

(54) FLUID FLOW PASSAGE STRUCTURE AND MANUFACTURING METHOD THEREOF

(75) Inventors: Keiichi Minegishi, Saitama (JP); Yasunori Yoshida, Toride (JP); Kouji Wada, Kashiwa (JP); Youichi Kawamura, Tsukubamirai (JP)

(73) Assignee: SMC Kabushiki Kaisha, Tokyo (JP)

(*) Notice: Subject to any disclaimer, the term of this patent is extended or adjusted under 35 U.S.C. 154(b) by 735 days.

(21) Appl. No.: 12/208,679

(22) Filed: Sep. 11, 2008

(65) Prior Publication Data

US 2009/0078329 A1    Mar. 26, 2009

(30) Foreign Application Priority Data

Sep. 21, 2007   (JP) ................. 2007-246021

(51) Int. Cl.
*F16K 11/10* (2006.01)
(52) U.S. Cl. ........................ 137/884
(58) Field of Classification Search ............ 137/884
See application file for complete search history.

(56) References Cited

U.S. PATENT DOCUMENTS

| | | | | |
|---|---|---|---|---|
| 2,871,886 A | * | 2/1959 | Obrebski et al. | 138/111 |
| 3,407,846 A | * | 10/1968 | Brandenberg | 137/884 |
| 3,646,963 A | * | 3/1972 | Klee | 137/884 |
| 3,814,126 A | * | 6/1974 | Klee | 137/884 |
| 4,509,553 A | * | 4/1985 | Hahn | 137/596 |
| 4,838,474 A | | 6/1989 | Ohashi et al. | |

FOREIGN PATENT DOCUMENTS

| | | |
|---|---|---|
| EP | 0 689 786 A1 | 1/1996 |
| GB | 1171025 | 11/1969 |
| GB | 1 255 896 | 12/1971 |
| JP | 5-62034 | 9/1993 |
| JP | 8-35506 | 2/1996 |
| JP | 9-79466 | 3/1997 |
| JP | 11-125378 | 5/1999 |
| JP | 2001-201275 | 7/2001 |
| JP | 2002-126852 | 5/2002 |
| JP | 2003-62671 | 3/2003 |
| JP | 2006-266576 | 10/2006 |

* cited by examiner

*Primary Examiner* — John Fox
(74) *Attorney, Agent, or Firm* — Oblon, Spivak, McClelland, Maier & Neustadt, L.L.P.

(57) ABSTRACT

A fluid flow passage structure and a manufacturing method therefor are provided, in which fluid flow passages can be easily produced employing a simple structure and process, while also being suitable for reducing the weight thereof. Wire members having a predetermined pattern are disposed between a first block member and a second block member. Airtight and fluidtight hermetic fluid flow passages are formed between such members, by forming the first block member, the second block member, and the wire members together as an integral structure.

19 Claims, 16 Drawing Sheets

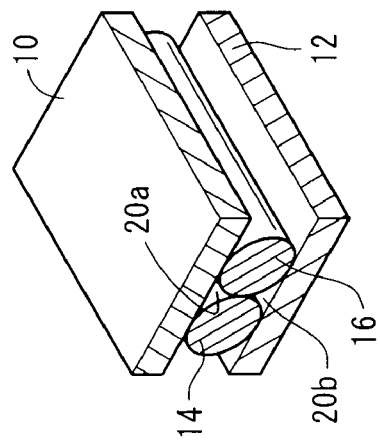
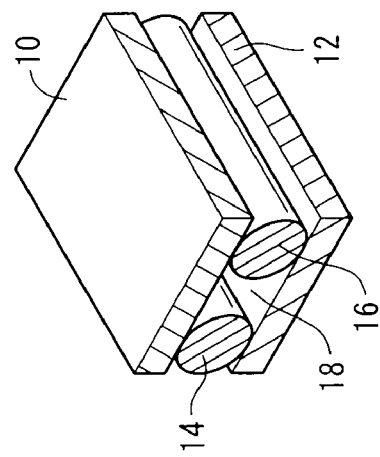
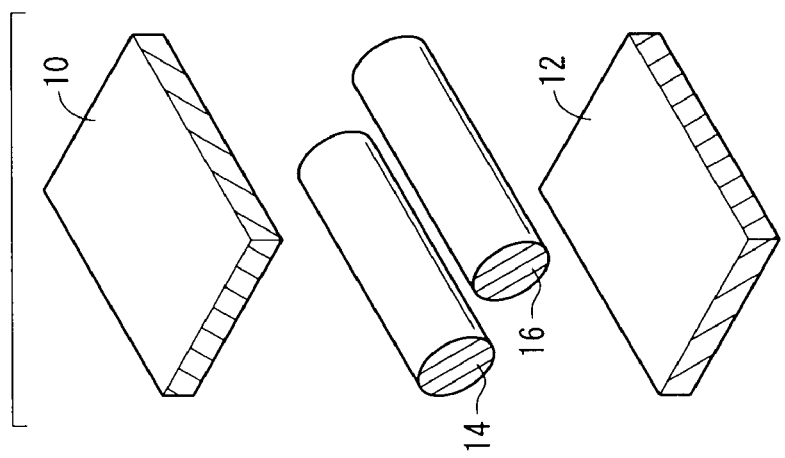

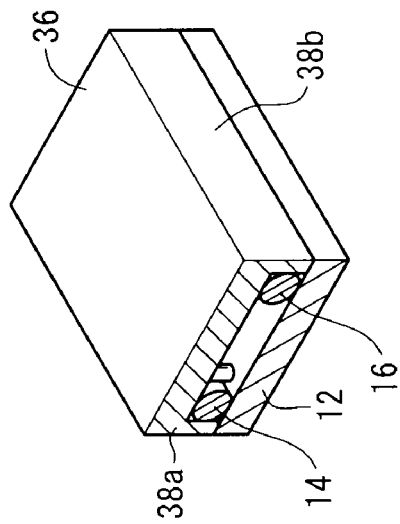
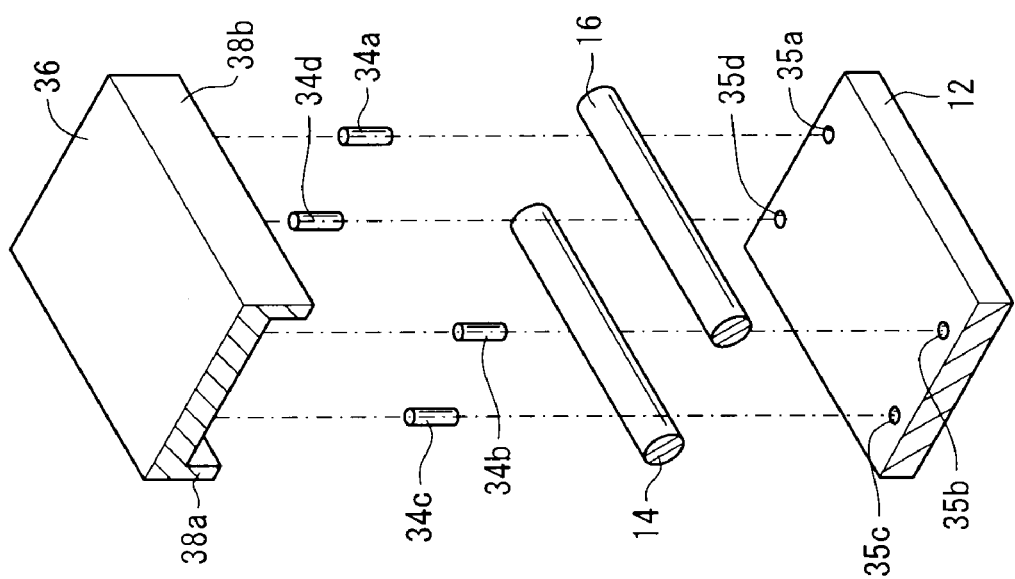

FLUID FLOW PASSAGE STRUCTURE AND MANUFACTURING METHOD THEREOF

BACKGROUND OF THE INVENTION

1. Field of the Invention

The present invention relates to a fluid flow passage structure as well as a manufacturing method thereof. More specifically, the invention concerns a fluid flow passage structure and manufacturing method for forming a fluid flow passage between block members by means of wires, by sandwiching and gripping the wires between a plurality of metallic block members.

2. Description of the Related Art

In a solenoid manifold, an ejector apparatus or the like, it has been known conventionally to form fluid flow passages within a body having a cubic or rectangular parallelepiped shape formed from metal. Various methods have been adopted for providing the fluid flow passages therein.

For example, in Japanese Laid-Open Patent Publication No. 08-035506, a technical concept is disclosed whereby, after forming fluid flow passages by means of photoetching or press processing in a pair of body portions, a lid and a bottom, which are manufactured separately, are stacked and joined thereto. (See, paragraphs [0003] and [0007] of Japanese Laid-Open Patent Publication No. 08-035506.)

Japanese Laid-Open Patent Publication No. 11-125378 discloses a technical concept for manufacturing a fluid pressure manifold 1, in which a stacked body is formed by metal plates 2a, 2b and 2c, in which a plurality of holes 3a, 3b are provided in the upper surface metal plate 2a and the lower surface metal plate 2c, and wherein a plurality of fluid flow passages 4 are formed by laser illumination in the metal plate 2b, which is placed between the two metal plates 2a and 2c. (See, Japanese Laid-Open Patent Publication No. 11-125378, paragraph [0020].)

Japanese Laid-Open Patent Publication No. 2003-062671 discloses a manufacturing method for a manifold, in particular, wherein fluid flow passages 3 are formed by a grinding process in a pair of split base pieces 4, 5 that make up a base member 1. (See, Japanese Laid-Open Patent Publication No. 2003-062671, paragraph [0010].)

However, in conventional techniques like the foregoing, for example, when grooves are formed by means of photoetching as disclosed in Japanese Laid-Open Patent Publication No. 08-035506, multiple processes must be carried out including preparations for such processes, and considerable time is required until the grooves are fully formed. In the case of press processing, costs required for the mold become quite substantial. In the case of laser illumination as in Japanese Laid-Open Patent Publication No. 11-125378 as well, the apparatus therefor is large in scale and high manufacturing costs cannot be avoided.

Further, when grooves are formed as in Japanese Laid-Open Patent Publication No. 2003-062671, complex carving of the groove formations is necessary according to the grinding process, such that the manufacturing process becomes complicated, with considerably long manufacturing times, and ultimately, production efficiency is not improved.

Moreover, a drill generally has been used in the case of forming fluid flow passages. For example, as shown in FIG. 16, when a bent fluid flow passage 4 is formed inside of one metallic block member 1 by a first fluid flow passage 2 and a second fluid flow passage 3, the following type of process is required. First, a first flow passage 2 is cut by a non-illustrated drill in one side surface 1a of the block member 1. Next, a second flow passage 3 is cut by a drill from a second side surface 1b. In addition, a blind plug 5 is used for blocking a connecting portion between the first flow passage 2 and the second flow passage 3.

Stated otherwise, the process used in forming the bent fluid flow passage inside the block member 1 is complex, and the numbers of parts used, such as the blind plug, are increased. Notwithstanding, in cases where the fluid flow passages 2, 3 are narrow, for example, having diameters of 1 mm or less, the drill also becomes narrow in width, such that the drill axis is deflected during cutting and accurate formation of the flow passages is difficult. Even further, it may be impossible to form curved fluid flow passages inside the block member 1 by means of a drill.

SUMMARY OF THE INVENTION

In consideration of the aforementioned problems, the present invention has the object of providing a fluid flow passage structure and a manufacturing method therefor, in which it is possible to form fluid flow passages with a large degree of freedom by utilizing wire materials, such that the device can be miniaturized and made lightweight, along with manufacturing the same at a low cost, while also improving production efficiency.

A fluid flow passage structure according to the present invention comprises:

a first block member;

a second block member; and a wire interposed between the first block member and the second block member, wherein an airtight or fluidtight hermetic fluid flow passage is formed by at least one of the first block member and the second block member and the wire.

In the fluid flow passage structure, the first and second block members are made of a metal material, and more preferably, are made from a light metal or a light metal alloy. Accordingly, durability is superior and a lightweight structure can be realized.

In this case, if the light metal or light metal alloy is aluminum or an aluminum alloy, processing at a low cost is facilitated.

Furthermore, if the wire is made of a metal material, and more preferably, is made from aluminum or an aluminum alloy, compatibility with the first and second block members is favorable.

On the other hand, a structure in which the first and second block members are made of stainless steel, and the wire is made of stainless steel, also is acceptable.

In this case, the process is simple, when the wire is pressed between the first and second block members, and a fluid flow passage is formed between the wire and the first block member or the second block member.

Furthermore, when one or more intermediate block members are disposed between the first and second block members, and a wire is interposed between the first block member and the intermediate block members, or between the second block member and the intermediate block members, such that the wire forms a portion of the fluid flow passage, an intricate flow passage structure can be obtained while enabling a compact configuration.

In particular, if a flow passage, which intersects and communicates with the flow passage formed by the wire, is formed in at least one of the first block member and the second block member, the flow passage structure can be developed in three dimensions.

Moreover, if the first and second block members are mutually positioned by pin members mounted between the first and second block members, a product having good manufacturing quality is obtained.

In addition, if a metal or synthetic resin material is filled in a gap formed between the first block member and the second block member, and the metal or synthetic resin material surrounds the wire that forms the fluid conduit at an outer side thereof, insofar as waste material does not invade into the gap and liquid does not accumulate therein, the apparatus may be used in a clean room or in food industry environments. In place of the metal or synthetic resin material, a spacer having substantially the same width as the wires may be interposed between the first and second block members.

Further, when the wire is disposed as a predetermined pattern between the first block member and the second block member, wherein the predetermined pattern and an airtight or fluidtight hermetic flow passage is formed by bringing the first and second block members into proximity, and by the wire and at least one of the first block member and the second block member, the manufacturing process is facilitated and simplified.

Furthermore, if the first and second block members are brought into proximity and pressed relatively against each other, in a state in which heat is applied to one of the first and second block members or the wire, thereby forming the fluid flow passage between the wire, an airtight or fluidtight flow passage structure can easily be obtained by means of a simple process.

In particular, when a portion of the first and second block members and the wire are mutually melted, and are made integral with each other by means of diffusion bonding or brazing, a highly hermetic fluid mechanism, which is excellent in terms of airtightness and/or fluidtightness, can be obtained.

The present invention is further characterized by positioning a wire having a predetermined pattern between first and second metal block members, relatively pressing the first and second block members so as to bring the block members into mutual proximity, and forming a fluid passage by the wire between the first and second block members.

In such a manufacturing method, when the first and second block members together with the wire are mutually pressed together and made integral, an effect is achieved in that the manufacturing process is simplified.

Furthermore, manufacturing is facilitated when the first and second block members and the wire are made integral by applied heat pressing, or by diffusion bonding or brazing. In particular, in the case of diffusion bonding, the contact area between the wire and the block members is suppressed and remains small, and plastic deformation of the bond interface occurs easily with a small force, so that bonding can be accomplished easily.

In this case, if a filling material is filled in a gap formed between the first and second block members after pressing the wire, a fluid flow passage structure that excels in terms of sanitation and cleanliness can be obtained.

In accordance with the present invention, merely by sandwiching and gripping the wire between the respective block members, a complex fluid flow passage, possessing a high degree of design freedom, can be easily manufactured at a low cost. Additionally, overall, a miniaturized and lightweight structure can be obtained.

The above and other objects features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 1A to 1C are views illustrating principles of the fluid flow passage structure of the present invention, in which FIG. 1A is a partial cutaway exploded perspective view of respective structural members thereof. FIG. 1B is a perspective view of an assembled state of the structural members of FIG. 1A, and FIG. 1C is a perspective view of a modified example of the fluid flow passage structure shown in FIG. 1B;

FIGS. 2A and 2B show a first embodiment of the fluid flow passage structure of the present invention, in which FIG. 2A is a partial cutaway exploded perspective view of respective structural members thereof, and FIG. 2B is a perspective view of an assembled state of the structural members of FIG. 2A;

FIGS. 5A and 5B show another embodiment of the fluid flow passage structure of the present invention, in which FIG. 5A is a partial cutaway exploded perspective view of respective structural members thereof, and FIG. 5B is a perspective view of an assembled state of the structural members of FIG. 5A;

FIGS. 6A and 6B show another embodiment of the fluid flow passage structure of the present invention, in which FIG. 6A is a partial cutaway exploded perspective view of respective structural members thereof, and FIG. 6B is a perspective view of an assembled state of the structural members of FIG. 6A;

FIGS. 7A and 7B show another embodiment of the fluid flow passage structure of the present invention, in which FIG. 7A is a partial cutaway exploded perspective view of respective structural members thereof, and FIG. 7B is a perspective view of an assembled state of the structural members of FIG. 7A;

FIGS. 9A and 9B show another embodiment of the fluid flow passage structure of the present invention, in which FIG. 9A is an exploded perspective view of respective structural members thereof, and FIG. 9B is a vertical cross sectional explanatory view of a state in which the structural members of FIG. 9A are assembled with a filling member disposed therein;

FIGS. 11A and 11B show another embodiment of the fluid flow passage structure of the present invention, in which FIG. 11A is an exploded perspective view of respective structural members thereof, and FIG. 11B is a perspective view of an assembled state of the structural members of FIG. 11A;

FIGS. 12A and 12B show another embodiment of the fluid flow passage structure of the present invention, in which FIG. 12A is an exploded perspective view of respective structural members thereof, and FIG. 12B is a perspective view of an assembled state of the structural members of FIG. 12A;

FIGS. 13A and 13B show another embodiment of the fluid flow passage structure of the present invention, in which FIG. 13A is an exploded perspective view of respective structural members thereof, and FIG. 13B is a perspective view of an assembled state of the structural members of FIG. 13A;

FIGS. 15A and 15B show a solenoid manifold used with the fluid flow passage structure of the present invention, in which FIG. 15A is a partial omitted perspective view, and FIG. 15B is a partial vertical cross sectional view thereof.

DESCRIPTION OF THE PREFERRED EMBODIMENTS

Figure 2A:
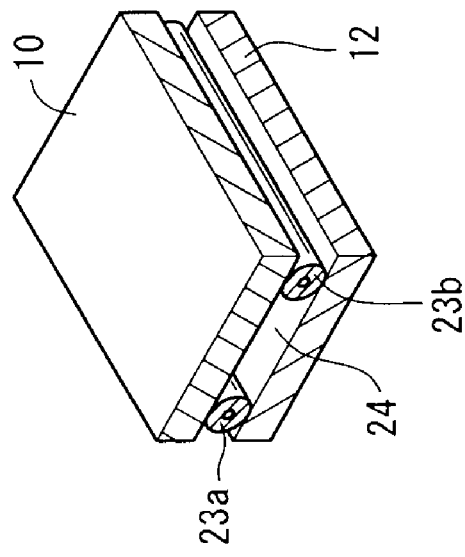

Next, detailed descriptions shall be given below with reference to the accompanying drawings concerning preferred embodiments of the fluid flow passage structure according to the present invention, in relation to manufacturing methods therefore.

First, the basic principles of the present invention shall be explained with reference to FIG. 1. In FIG. 1, reference numeral 10 indicates a first block member, whereas reference numeral 12 indicates a second block member. The first block member 10 and the second block member 12 are formed by metallic plates, preferably made from aluminum or an aluminum alloy. The block members 10, 12 also may be made from stainless steel. In FIG. 1, reference numeral 14 indicates a first wire, whereas reference numeral 16 indicates a second wire. When the first wire 14 and the second wire 16 are configured as single wires, formed for example from light metals, preferably aluminum or an aluminum alloy, a flow passage structure that excels in properties of airtightness or fluidtightness can be obtained. When the block members 10, 12 are made of stainless steel as described previously, it is preferable for the first and second wires 14, 16 also to be made of stainless steel, since this makes compatibility good when the wires 14, 16 and the block members 10, 12 are integrated.

For constructing the fluid flow passage, the first wire 14 and the second wire 16 are interposed between the first block member 10 and the second block member 12, whereupon pressure is applied to the first block member 10 and the second block member 12 to cause them to approach relatively toward one another. As a result, an airtight or fluidtight space, that is, the fluid flow passage 18, is formed between the first block member 10 and the second block member 12 and between the first wire 14 and the second wire 16 (see FIG. 1B). In this case, the first block member 10 and the second block member 12 may be clamped together by non-illustrated bolts, in a state where the wires 14, 16 are sandwiched and gripped therebetween.

In the case that the first block member 10 and the second block member 12 are pressed and made to approach relatively toward each other, if the first block member 10 and the second block member 12, and preferably the first wire 14 and the second wire 16 as well, are heated to a predetermined temperature, integration of the members is facilitated when the members are pressed mutually together, and a fluid flow passage 18, which is excellent in terms of airtightness or fluidtightness, can easily be obtained.

In place of an applied heating process, for example, it is a matter of course that other processes, such as diffusion bonding, may be applied to the three members. In this case, assuming that the first block member 10 and the second block member 12 are pressurized and integrated, with the first wire 14 and the second wire 16 being positioned in mutual contact with each other as shown in FIG. 1C, a flow passage 20a is formed between the first block member 10 and the first and second wires 14 and 16, and beneath the flow passage 20a, another flow passage 20b is formed between the second block member 12 and the first and second wires 14 and 16. The sizes of the flow passage 18 and the flow passages 20a, 20b can be formed by selecting the interval between the wires 14 and 16, or by selecting the thickness, i.e., the diameters, of the wire members, as well as by arbitrarily selecting the cross sectional shapes thereof, for example, to have rectangular shapes, diamond shapes, elliptical shapes, or the like. In this case, the wires 14 and 16 may be formed utilizing various processes, such as extrusion, drawing, injection molding, press molding, MIM powder metallurgy processing, die cast molding, mechanical processing, etc. The first block member 10 and the second block member 12 may be formed in a similar manner. In this way, by means of an extremely simple process, one or more fluid flow passages can be formed. In addition, if the flow passage forming surfaces of the first block member 10 and the second block member 12 are formed as strictly planar surfaces beforehand, for example by mirror finishing, after formation of the flow passages, a flattening (planarization) process becomes unneeded and can suitably be dispensed with. In FIGS. 1A to 1C, although the first block member 10 and the second block member 12 are portrayed as flat plates, and further, the wires 14, 16 are shown as simple wires having straight shapes, this has been done merely for the purpose of explaining the principles and fundamental concepts of the present invention. It is a matter of course that various modifications are possible, such as forming the first block member 10 and the second block member 12 as rectangular bodies similar to those of a solenoid valve manifold, and bending or curving the wires 14, 16 to form a predetermined pattern, or providing a plurality of different fluid flow passages, and the like. In accordance with the above principles, practical examples and applications of the present invention shall now be explained.

Figure 2B:
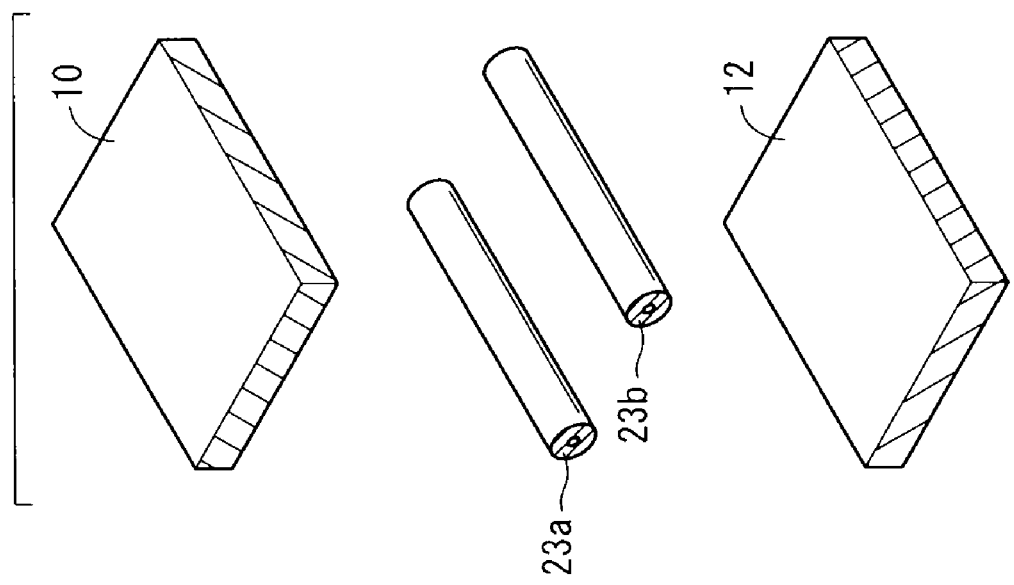

In FIG. 2A, structural elements thereof, which correspond to the features shown in FIG. 1A, are designated using the same reference numerals, and detailed explanations of such features shall be omitted. In this case, as made clear by comparing FIGS. 1A and 2A, according to the structure shown in FIG. 2, with respect to the first wire 14 and the second wire 16, the first wire 23a and the second wire 23b are smaller in diameter than the first wire 14 and the second wire 16, and moreover are constituted by hollow shapes, to thereby obtain a fluid flow passage 24 (see FIG. 2B). By selecting wires that are smaller in diameter, the flow passage structure shown in FIG. 1B can be made smaller in size, that is, a flow passage structure having a small thickness in the vertical or heightwise direction thereof, can be obtained. In addition, because hollow wires 23a, 23b are used, an advantage results in that a process is facilitated in which the wires 23a, 23b are pressed and crushed when gripped under pressure by the first and second block members 10, 12. Naturally, the hollow portions of the first wire 23a and the second wire 23b can also be used as further additional fluid flow passages.

Figure 3:
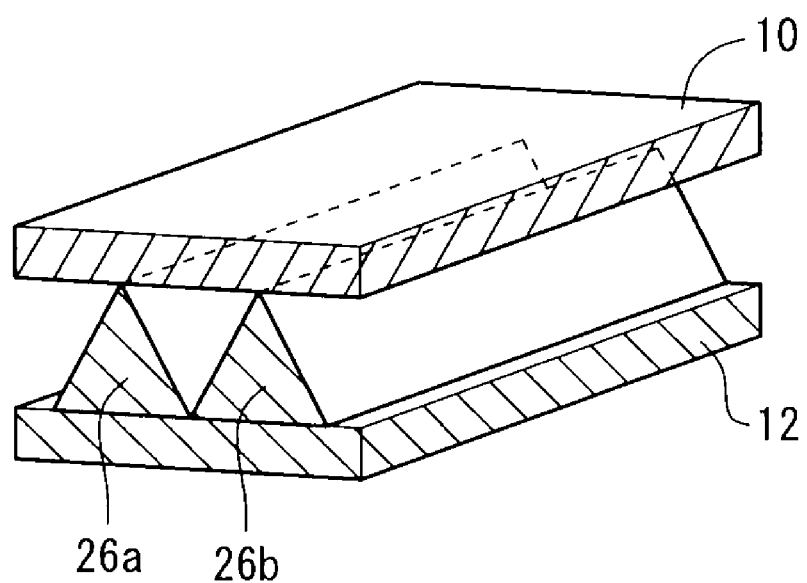
FIG. 3 is a partial cutaway perspective view of another embodiment of the fluid flow passage structure of the present invention.

The structure shown in FIG. 3 differs in that, compared to the wire members used in FIGS. 1 and 2, which are circular in cross section, the wires 26a, 26b have triangular shapes in cross section, whereby an example is shown in which the present invention can be realized even though the shape of the wires is different. From this viewpoint, as was indicated previously, the wires may be formed with any arbitrary cross sectional shape, such as rectangular shapes, elliptical shapes or the like, depending on the requirements of the situation.

More specifically, according to the present invention, the cross sectional shape and size of the wires can be selected arbitrarily depending on the intended use or application thereof. As a result, there is an advantage in that the degree of freedom in designing the fluid flow passage structure can be enhanced substantially.

Figure 4:
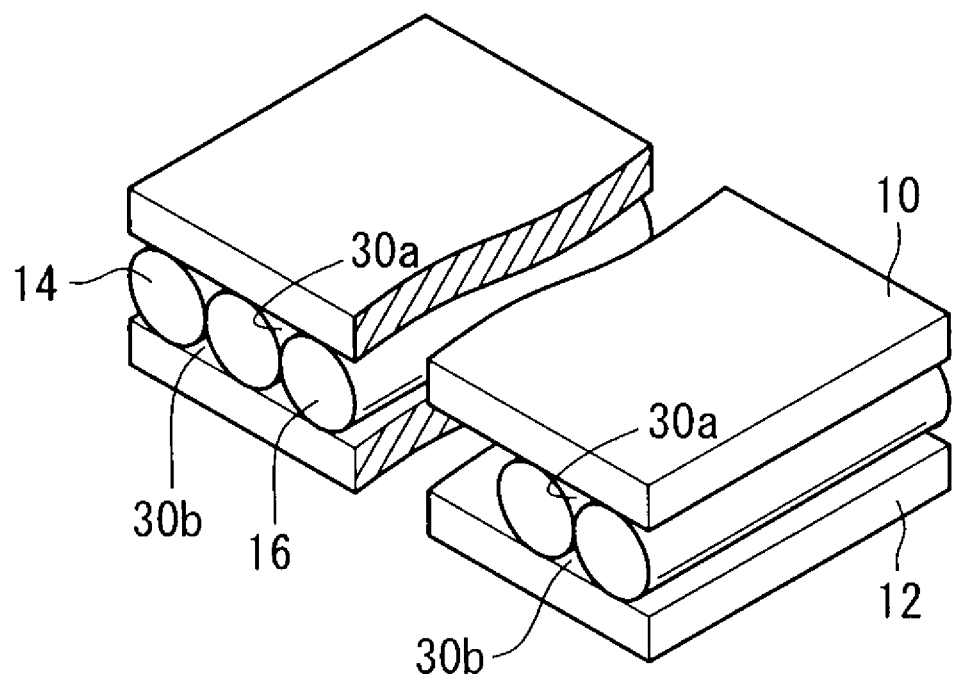
FIG. 4 is a partial cutaway perspective view of another embodiment of the fluid flow passage structure of the present invention.

FIG. 4 shows a further modified example of the structure of FIG. 1C. In this case, in FIG. 1C, respective fluid flow passages 20a, 20b were formed using the first wire 14 and the second wire 16, however, in the embodiment of FIG. 4, the number of wires is three or greater, and as a result, any desired number of flow passages 30a and 30b can be formed. Stated otherwise, by sandwiching a plurality of wires between the first block member 10 and the second block member 12 and forming an integral structure therefrom, the fluid flow passages can be formed in multiple groups between the mutually adjacent wires. Accordingly, for example, a manifold can be obtained, in which a desired number of flow passages are formed between the first block member 10, the second block member 12, and the wires 14, 16.

Figure 5B:
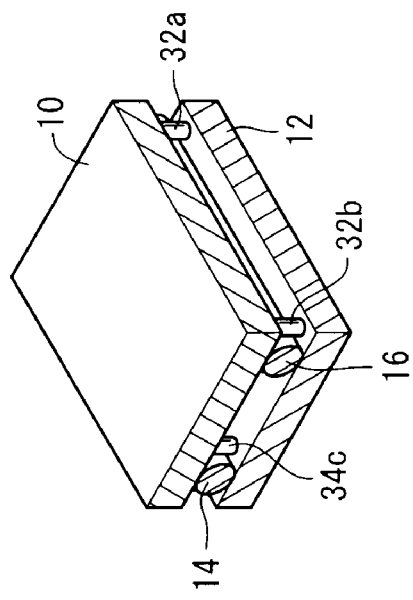
Figure 5A:
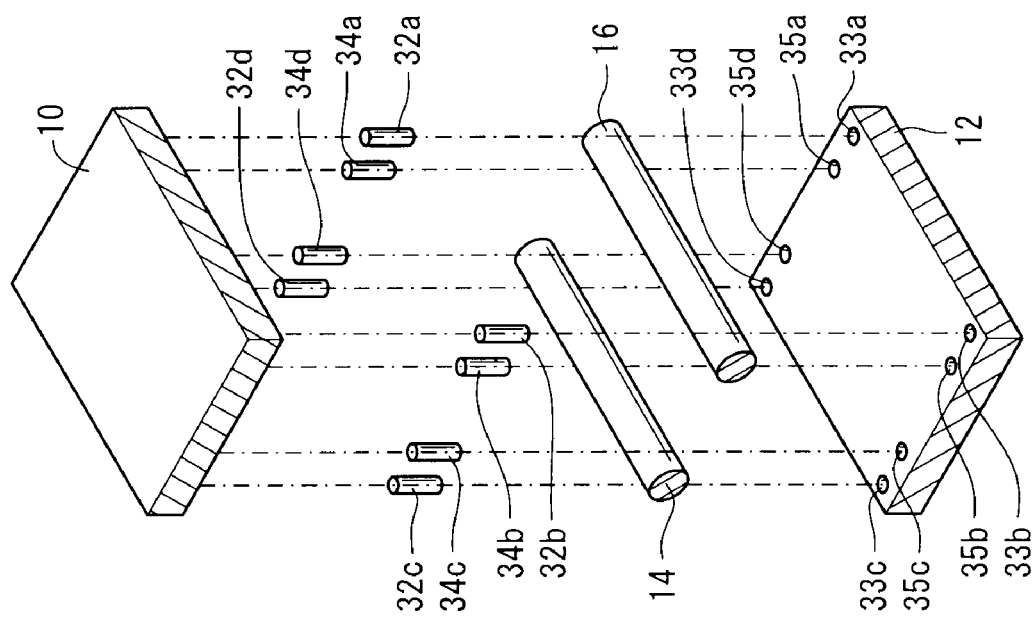

FIG. 5 shows another embodiment. In this case, pin members 32a, 32b, 32c and 32d are implanted between the first block member 10 and the second block member 12. When the first block member 10 and the second block member 12 are placed in proximity, the pin members 32a to 32d are inserted therein using holes 33a to 33d, which are formed in the first and second block members 10 and 12, so that when the first block member 10 and the second block member 12 are joined, a structure is formed in which the first and second block members 10 and 12 are positioned by means of the pin members 32a to 32d. Furthermore, using the pin members 34a to 34d, if respective holes 35a to 35d are formed in the first block member 10 and the second block member 12 and the pin members are implanted therein, the first wire 14 and the second wire 16 can be gripped and supported between the pin members 32a to 32d (see FIG. 5B). Thus, not only are the first block member 10 and the second block member 12 positioned thereby, but positioning of the first wire 14 and the second wire 16 also becomes possible. Of course, it may be considered to make the pin members 34a to 34d smaller in diameter compared to the pin members 32a to 32d, in order to reduce the flow passage resistance of the flow passage formed by the wires 14 and 16.

FIG. 6 shows a further embodiment. In this case, in place of the first block member 10 shown in FIG. 5, a third block member 36 is used. The third block member 36, as easily understood from FIG. 6A, is formed with an inverted U-shape in cross section, wherein the positions of the outer sides of the first wire 14 and the second wire 16 are regulated by leg portions 38a, 38b of the third block member 36. Accordingly, the wires 14, 16 are fixed in position by the pin members 34a to 34d and the leg portions 38a, 38b.

Figure 7B:
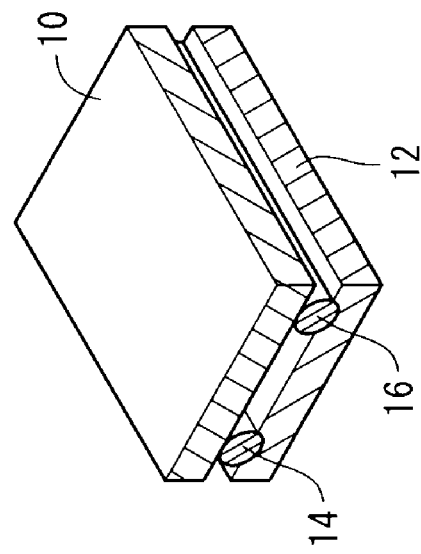
Figure 7A:
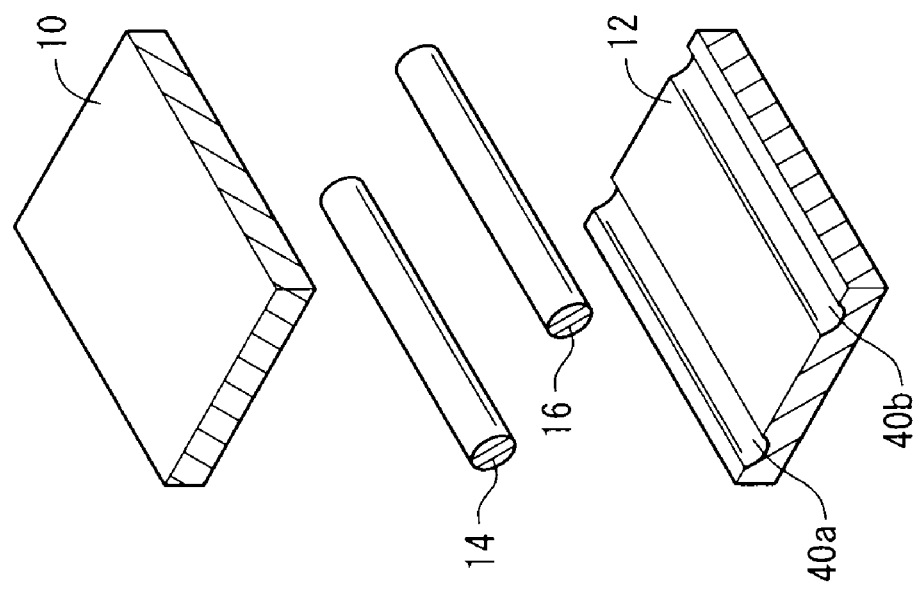

In place of the above structures, as shown in FIG. 7, another method for positioning the wires 14, 16 may be considered. More specifically, in the embodiment shown in FIG. 7, in place of the flat second block member 12 as used in the foregoing embodiments, shallow grooves 40a, 40b, which correspond with the shapes of the first wire 14 and the second wire 16, are disposed respectively in the second block member 12. In accordance therewith, as shown in FIG. 7B, accurate positioning of the first and second block members 10, 12 and the wires 14, 16 can be achieved, while also resulting in improving the airtightness or fluidtightness with respect to the fluid of the flow passage. Of course, in place of the grooves 40a, 40b, projections may also be provided, which follow along the outer sides of the wires 14 and 16, whereby outward displacement of the wires 14, 16 is prevented thereby.

Figure 8:
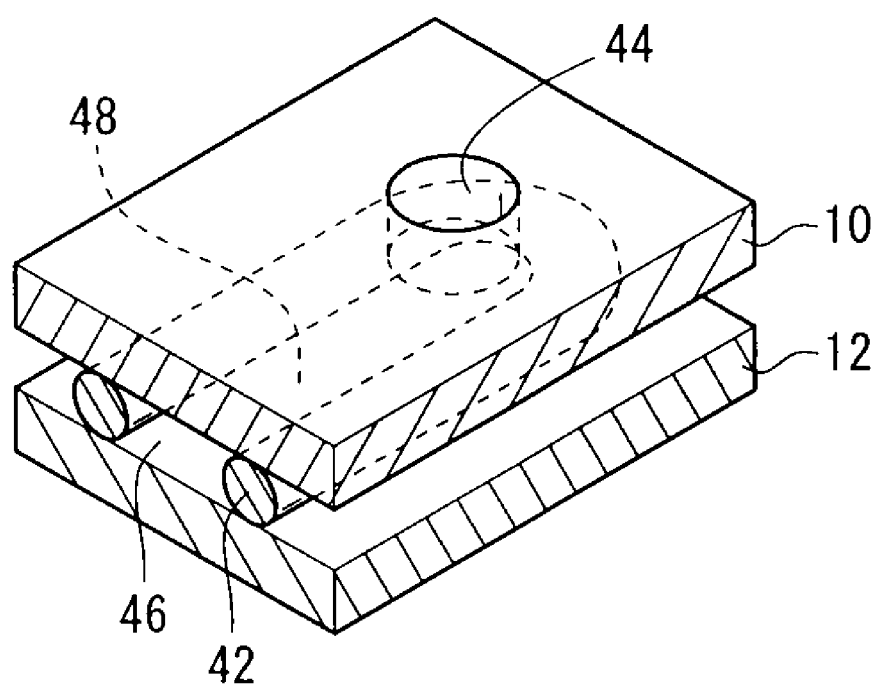
FIG. 8 is a partial cutaway perspective view of another embodiment of the fluid flow passage structure of the present invention.

FIG. 8 shows yet another embodiment of the present invention. In this embodiment, a wire 42 is bent in a U-shape between the first block member 10 and the second block member 12, and a lower end of a circular hole 44 is formed in the first block member 10, such that the hole 44 confronts an inside space of the U-shape, which is formed by the wire 42. Additionally, if a valve, for example, is installed at an opening 46 formed by two ends of the wire 42, a pressure fluid that is supplied from the hole 44 can pass through the passage 48 formed by the U-shaped wire, and reach the non-illustrated valve from the opening 46. Accordingly, assuming the valve is placed facing toward the opening 46, for example, the pressure fluid can be allowed to pass, or passage thereof interrupted, under operation of the valve.

Figure 9A:
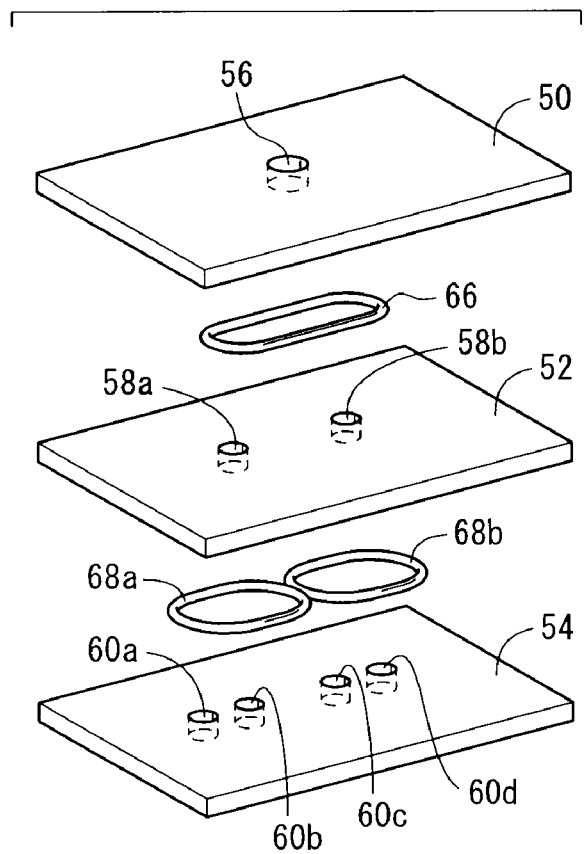

FIG. 9 shows still another embodiment of the present invention. In the embodiment shown in FIG. 9, at least a first block member 50, a second block member 52 (intermediate block member), and a third block member 54, which are flat in shape, are used. A through hole 56 is formed in the first block member 50, through holes 58a and 58b are formed in the second block member 52, and through holes 60a to 60d are formed in the third block member 54.

Figure 9B:
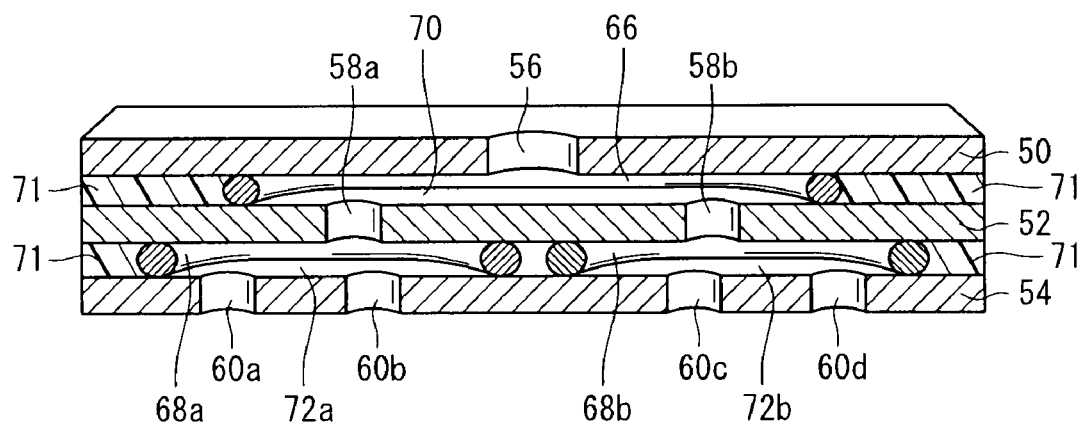

In addition, a first wire 66 is disposed so as to surround the through holes 58a, 58b on the first block member 50 and the second block member 52, whereas the wire 68a is disposed surrounding the through holes 60a, 60b, and the wire 68b is disposed surrounding the through holes 60c, 60d, between the second block member 52 and the third block member 54. The first block member 50, the second block member 52 and the third block member 54 are stacked respectively in a state with the wires 66, 68a and 68b interposed therebetween, whereupon by application of heat thereto, and integration of such members, the structural body shown in FIG. 9B is obtained.

More specifically, the pressure fluid that flows inwardly from the through hole 56 reaches the chamber 70 constituted by the wire 66, whereupon the pressure fluid in the chamber 70 subsequently reaches the chambers 72a, 72b, which are formed between the second block member 52 and the third block member 54, via the through holes 58a and 58b. Because an airtight or a fluidtight condition is retained in the chambers 72a, 72b by the wires 68a, 68b, the pressure fluid is furthermore made to flow in a branched manner respectively at the same pressure into other fluid pressure devices via the through holes 60a and 60b, and furthermore, the pressure fluid in the chamber 72b surrounded by the wire 68b similarly is made to flow in a branched manner at the through holes 60c and 60d, and can be conveyed to other fluid pressure devices. As can be appreciated clearly from this embodiment, by means of an extremely simple structure, a branched flow circuit of the pressure fluid can be constructed.

In the event that such a stacked structure is adopted, between the first and second block members 50 and 52, as well as between the second block member 52 and the third block member 54, a metallic or synthetic resin material 71 may be filled on the outer sides of the wire 66 and the wires 68a, 68b. Such a configuration serves to prevent refuse and waste material from entering into gaps, and to make the accumulation of liquid within the gaps unlikely to occur. Such a feature is favorable for clean room environments, or in industries related to food preparation.

Figure 10:
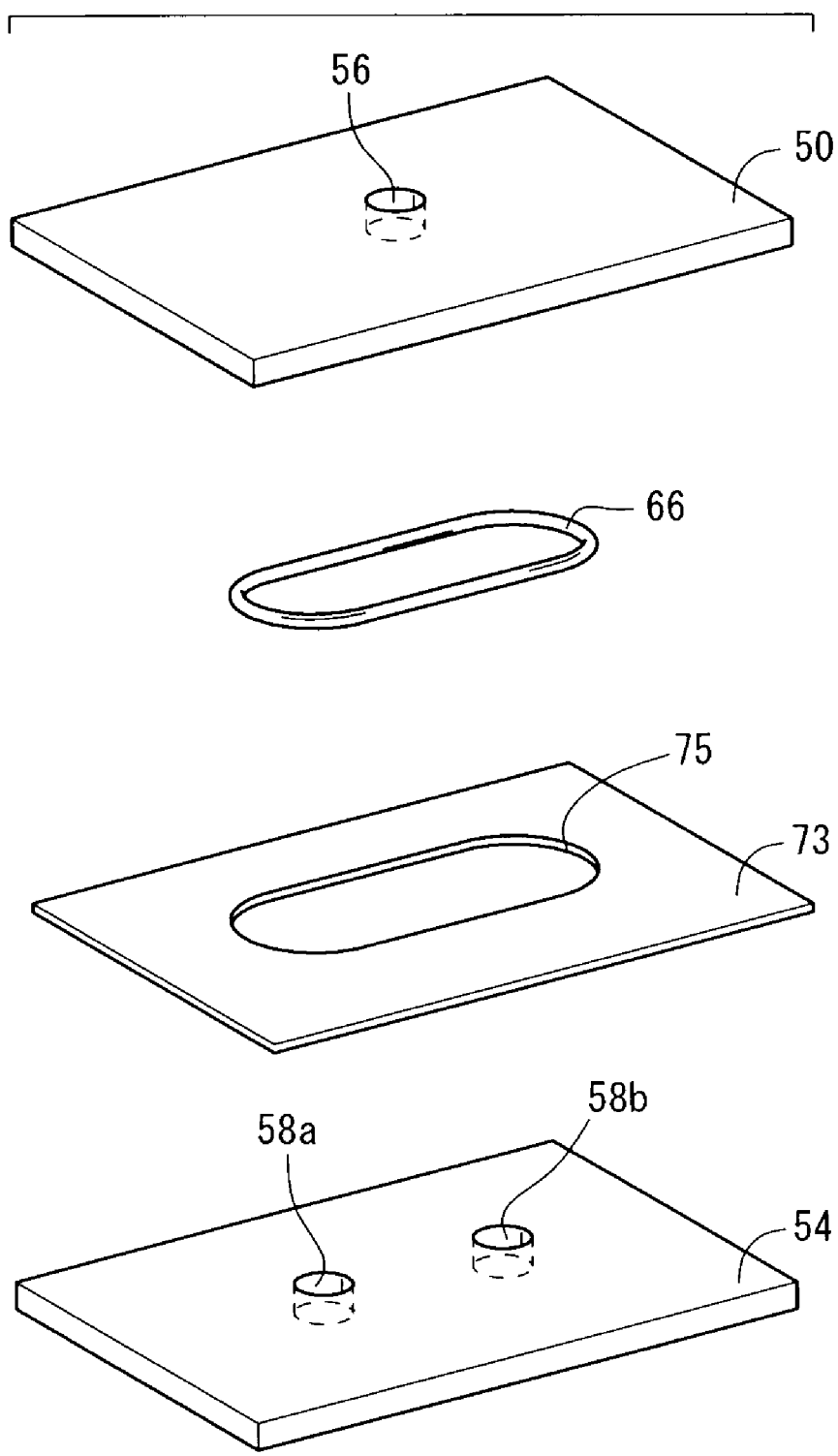
FIG. 10 shows another embodiment of the fluid flow passage structure of the present invention, which is an exploded perspective view of respective structural members thereof.

From the same perspective, another embodiment is shown in FIG. 10. With this embodiment, in place of the synthetic resin material 71 shown in FIG. 9, a spacer 73 is utilized. More specifically, the spacer 73, for example, has an overall size that is the same as the first and second block members 50, 52, and also has a thickness which is the same as the diameter of the wire 66. In addition, the spacer 73 has an oblong hole 75 in a center portion thereof, in which the wire 66 is received.

In such a structure, the spacer 73 is interposed between the first and second block members 50, 52 with the wire 66 being arranged inside of the spacer 73. That is, the wire 66 is positioned and fixed in place by the spacer 73. Owing thereto, when the first and second block members 50, 52, the spacer 73 and the wire 66 are compressed and made integral, shifting in position of the wire 66 does not occur, and further, by means of the spacer 73, entry of refuse or waste material between the first and second block members 50, 52 can be avoided.

Figure 11A:
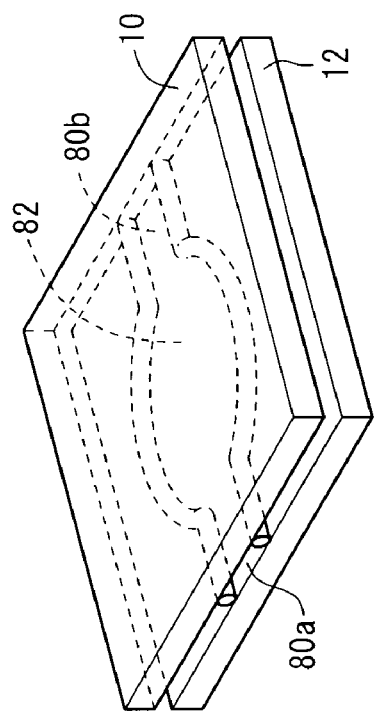
Figure 11B:
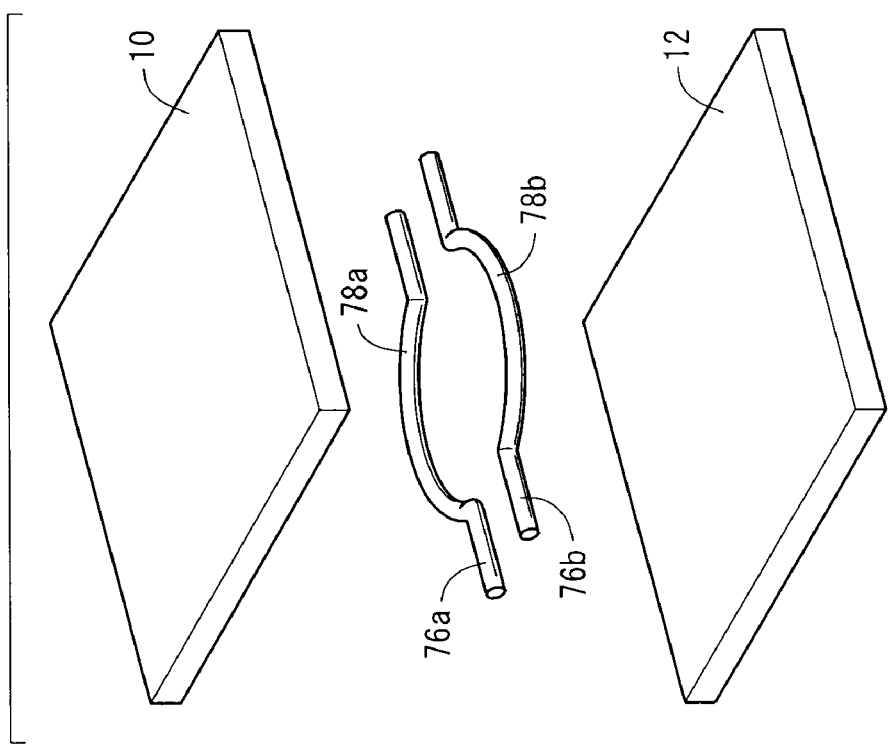

FIG. 11 shows another embodiment of the present invention. Specifically, according to this embodiment, wires 76a, 76b are disposed while being separated by a predetermined interval between the first block member 10 and the second block member 12. The wires 76a, 76b are provided with bent portions 78a, 78b, by which the wires 76a, 76b are further separated mutually from each other at an intermediate location. Additionally, by interposing the wires 76a, 76b between the first block member 10 and the second block member 12, and integrally joining the three members, the structural body shown in FIG. 11B is obtained. More specifically, an inlet side fluid flow passage 80a is obtained at one end of the wires 76a, 76b, whereas an outlet side fluid flow passage 80b is obtained at the other end of the wires 76a, 76b. That is, the wires 76a and 76b as a whole constitute the fluid flow passage. In addition, between the fluid flow passages 80a and 80b, at a given portion thereof, a tank for retaining the pressure fluid, or a buffer portion 82, can be formed. Formerly, providing this type of tank or buffer portion has required extremely complicated processing steps as well as considerable time by performing cutting processing with respect to the first block member 10 and the second block member 12. However, in the present embodiment, simply by bending the wires 76a, 76b in such a manner at a desired location and by gripping the first block member 10 and the second block member 12 under pressure, this type of buffer portion 82 can be formed in an extremely simple manner.

Figure 12A:
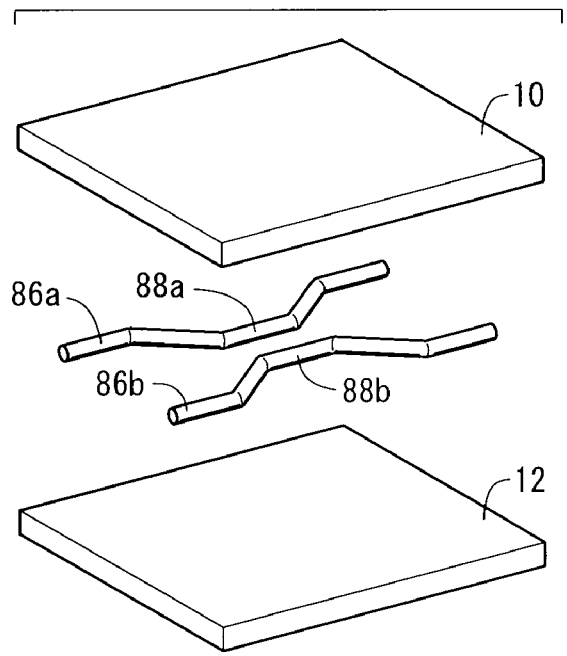
Figure 12B:
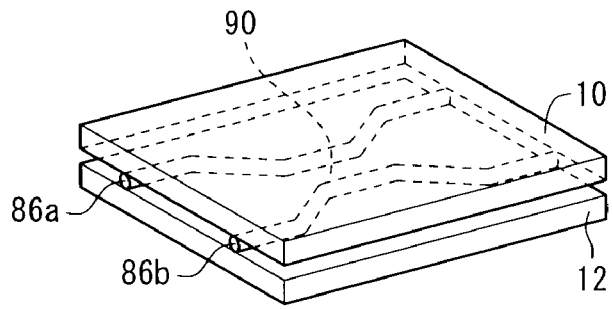

FIGS. 12A and 12B show another embodiment of the present invention. In this case, the invention differs in that, in place of the buffer portion shown in FIG. 11B, an orifice 90 is formed, by which the flow passage is restricted in an opposite manner. More specifically, wires 86a, 86b are disposed between the first block member 10 and the second block member 12. The wires 86a, 86b are disposed on the second block member 12 while being separated by a predetermined interval. The wires 86a, 86b are provided with bent portions 88a, 88b, by which the wires 86a, 86b are made to approach mutually toward each other at an intermediate location. The wires 86a, 86b configured in this manner are gripped under pressure by the first block member 10 and the second block member 12, thereby obtaining the structural body illustrated in FIG. 12B. That is, as can easily be appreciated from the figures, due to the presence of the bent portions 88a and 88b, which make up a part of the fluid flow passage, a structure results in which the orifice 90 is formed.

In this manner, by creating a flow passage of a predetermined narrow interval at which the wires 86a, 86b are made to mutually approach toward each other via the bent portions 88a, 88b thereof, the narrow passage can be utilized as the orifice 90.

Figure 12C:
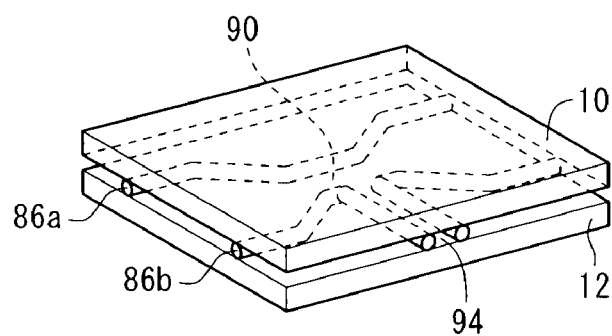
FIG. 12C shows a modified example of the structures shown in FIGS. 12A and 12B.

As a modified example of the aforementioned structure, for example, as shown in FIG. 12C, the bent portion 88b of the wire 86b is severed at a midway position, and wires 92a, 92b made up of the same cross section are obtained, whereby a further opening 94 is formed by the end portions thereof. In addition, a suction pad or the like (not shown) may be connected to the opening 94. With such a structure, compressed air is supplied from an end of the wires 86a, 86b, and assuming the compressed air is throttled by the orifice 90 and forcefully ejected from the other end, air is sucked from the opening 94, thus creating a vacuum at an opposite side thereof. That is, the unit functions as an ejector, and therefore using the non-illustrated suction pad, the structure can be utilized, for example, as a transport apparatus.

Figure 13A:
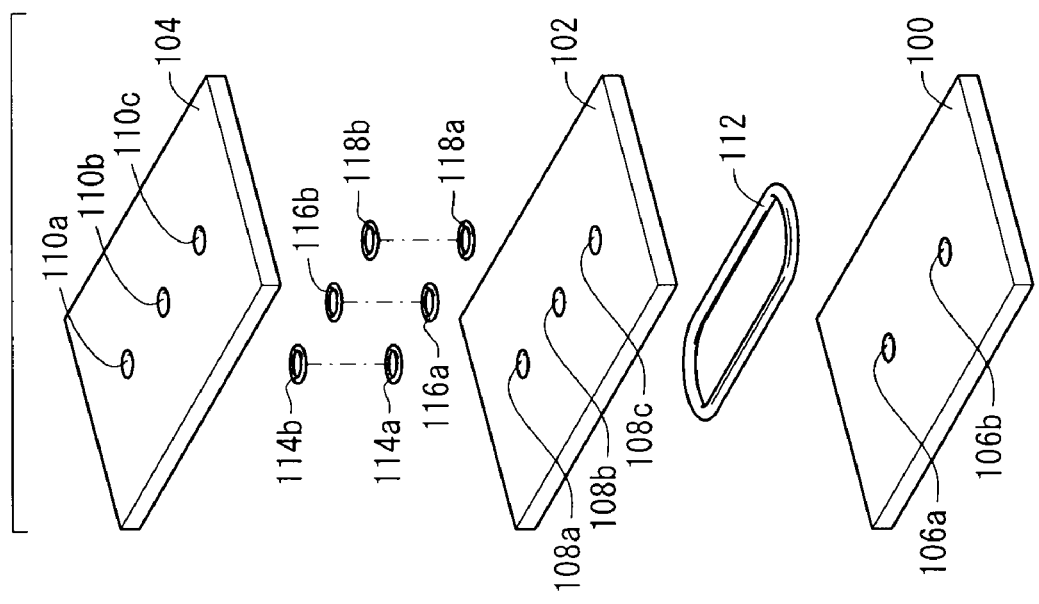
Figure 13B:
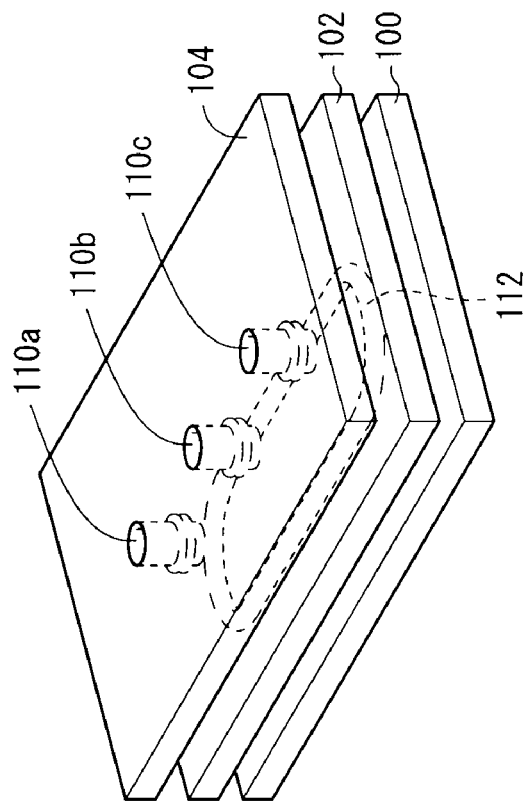

FIG. 13 shows a further embodiment of the present invention. Although this embodiment corresponds with the fluid flow passage structure that was illustrated in FIGS. 9A and 9B, the embodiment includes a first block member 100, a second block member 102, and a third block member 104. The first block member 100 is equipped with through holes 106a, 106b, and the second block member 102 includes through holes 108a, 108b and 108c therein. Additionally, the third block member 104 includes through holes 110a, 110b and 110c therein. An oblong shaped wire 112 is disposed between the first block member 100 and the second block member 102 so as to surround the through holes 106a, 106b, whereas wires 114a, 114b, 116a, 116b, and 118a, 118b are disposed between the second block member 102 and the third block member 104 surrounding each of the through holes 108a to 108c. As easily understood from the figure, the wires 114a and 114b, the wires 116a and 116b, and the wires 118a and 118b, are mutually stacked on each other respectively, while being interposed between the second block member 102 and the third block member 104. Accordingly, the wires 112, 114a, 114b, 116a, 116b and 118a, 118b are pressed mutually by the first block member 100, the second block member 102 and the third block member 104, to thereby obtain the structural body illustrated in FIG. 13B. More specifically, as can be comprehended easily from this embodiment, the stacked wires 114a, 114b, or 116a, 116b, as well as 118a, 118b, can be used to form fluid flow passages, which are perpendicular to the diametrical directions of the through holes 108a, 108b and 108c. Stated otherwise, the wires not only provide planar fluid flow passages between the block members, but rather by stacking the wires, fluid flow passages can be formed in directions that run perpendicular to or intersect the direction in which the members extend. Of course, the synthetic resin material 71 as shown in FIG. 9B, or the spacer shown in FIG. 10, may also be interposed in the gaps between the first, second and third block members 100, 102, 104.

Figure 14:
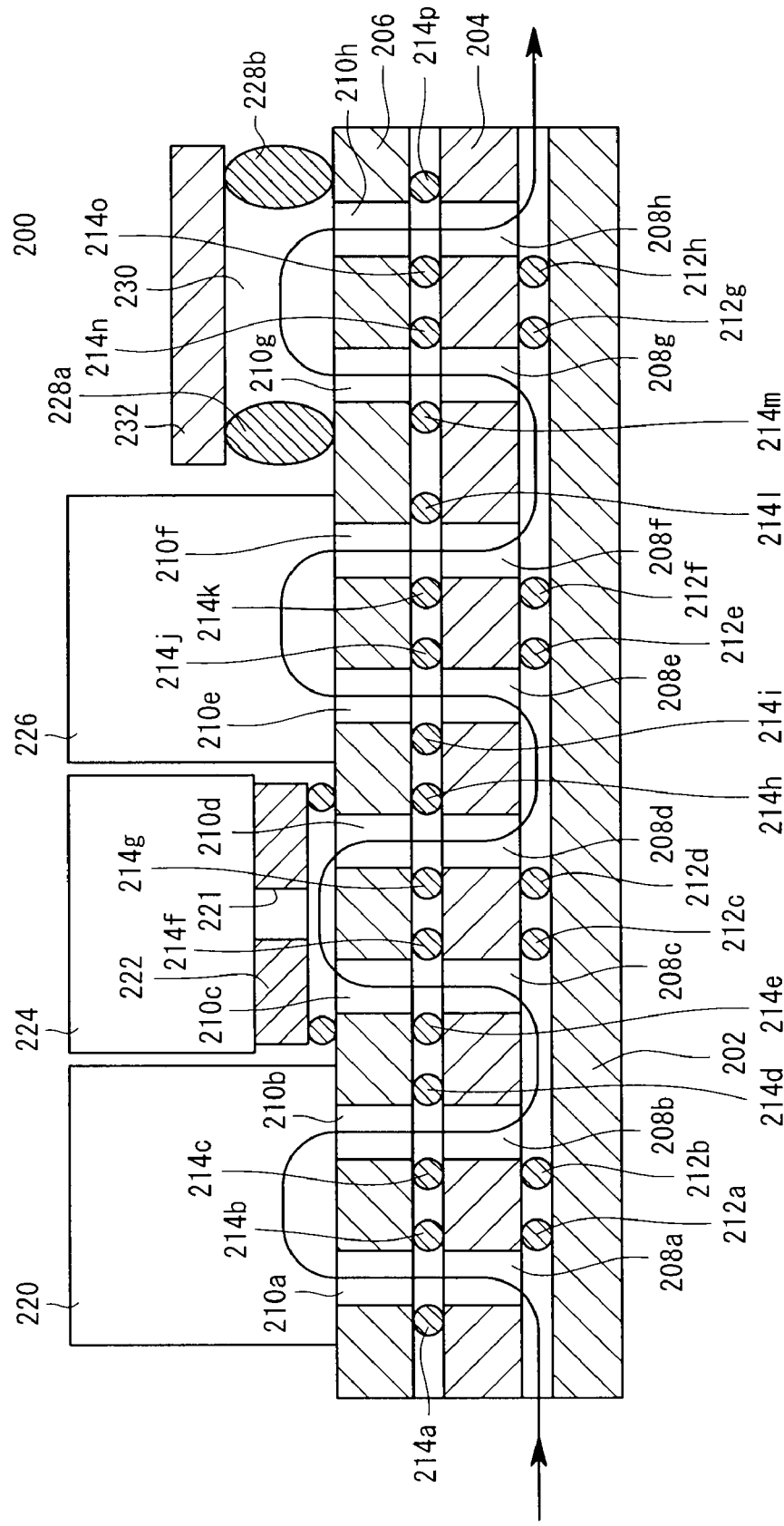
FIG. 14 is a vertical cross sectional explanatory view of essential parts of a fluid pressure device used with the fluid flow passage structure of the present invention.

A further embodiment of the present invention is shown in FIG. 14. The fluid apparatus 200 includes members, more specifically a first plate member 202, which is formed from a light metal such as aluminum or the like, or from an aluminum alloy, and further includes a second plate member 204 and third plate member 206, which are stacked on the first plate member 202. The second plate member 204 and the third plate member 206 may be formed from materials similar to the materials used for the first plate member 202. Through holes 208a to 208h are formed in directions perpendicular to the direction of extension of the second plate member 204, while through holes 210a to 210h also are formed in the third plate member 206 in a similar manner. Between the first plate member 202 and the second plate member 204, and more particularly between the through holes 208a and 208b thereof, wires 212a and 212b are formed as shown in the figure. Further, wires 212c and 212d are disposed between the through holes 208c and 208d, wires 212e and 212f are disposed between the through holes 208e and 208f, and wires 212g and 212h are disposed between the through holes 208g and 208h. As shown in FIG. 14, between the second plate member 204 and the third plate member 206, wires 214a to 214p are disposed corresponding to the respective through holes. A regulator 220 is disposed between the through holes 210a and 210b. Further, a pressure gauge 224 is disposed between the through holes 210c and 210d, via a plate member 222 having a hole 221 therein. An ON/OFF valve 226 is disposed between the through holes 210e and 210f, and a tank 230, which is surrounded by comparatively large wires 228a, 228b, is disposed between the through holes 210g and 210h. An upper surface of the tank 230 is blocked by a plate member 232. More specifically, a required fluid apparatus is constructed using the first plate member 202, the second plate member 204, and the third plate member 206, as well as the fourth plate member 222, the fifth plate member 232 and the wires, or by using the regulator 220, the pressure gauge 224, and the ON/OFF valve 226. With such an apparatus, as shown in FIG. 14, because the wires extend in directions perpendicular to the drawing as shown in cross section, communicating respectively with the regulator 220, the pressure gauge 224, the ON/OFF valve 226 and the tank 230, and further because the processing therefor is simple, and it is unnecessary for pressure fluid passages to be formed therein by means of a cutting process or the like, the apparatus can be constructed easily and at a low cost.

Figure 15A:
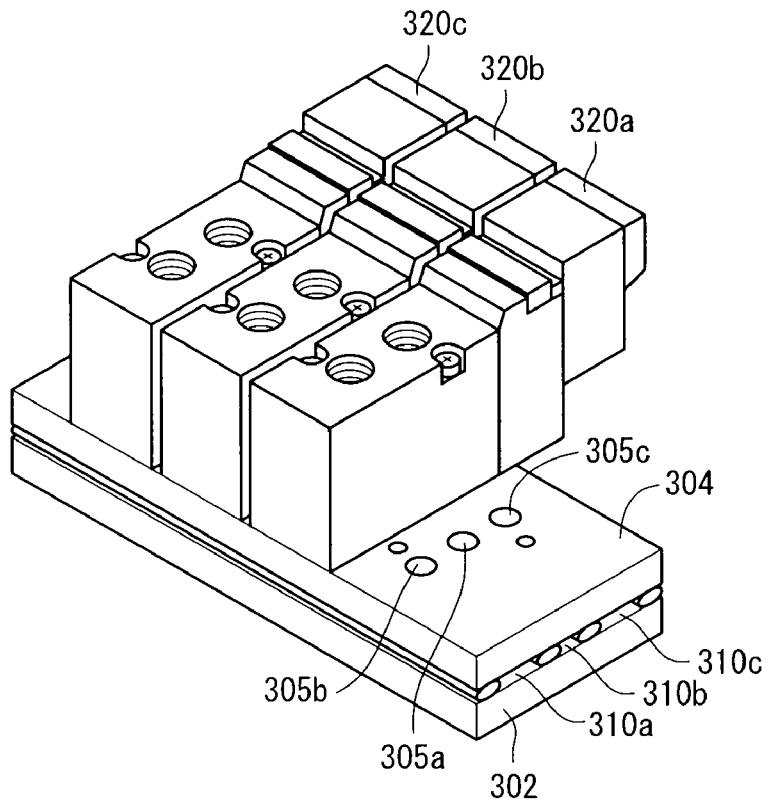
Figure 15B:
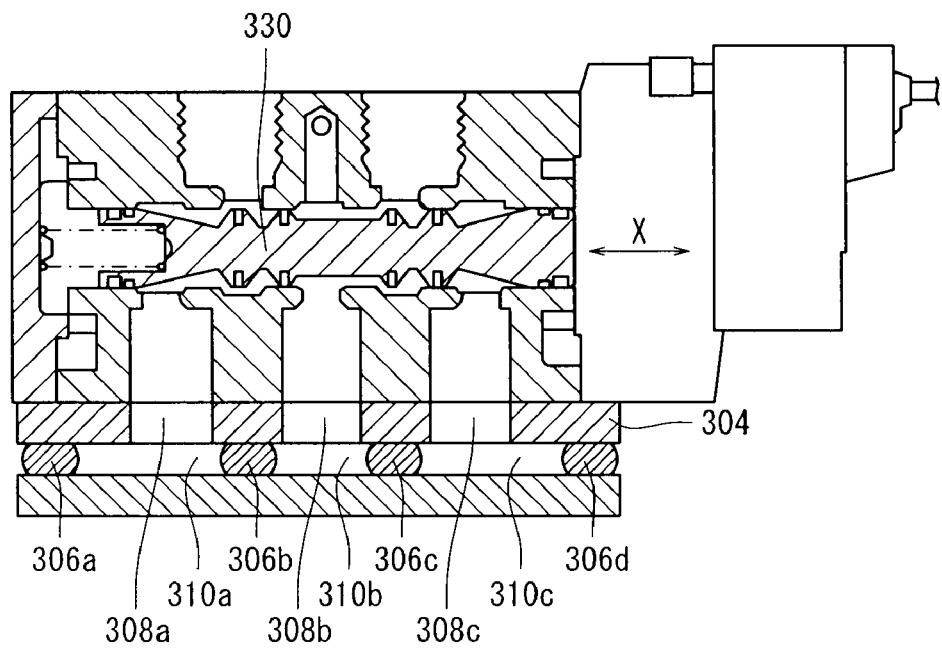
Figure 16:
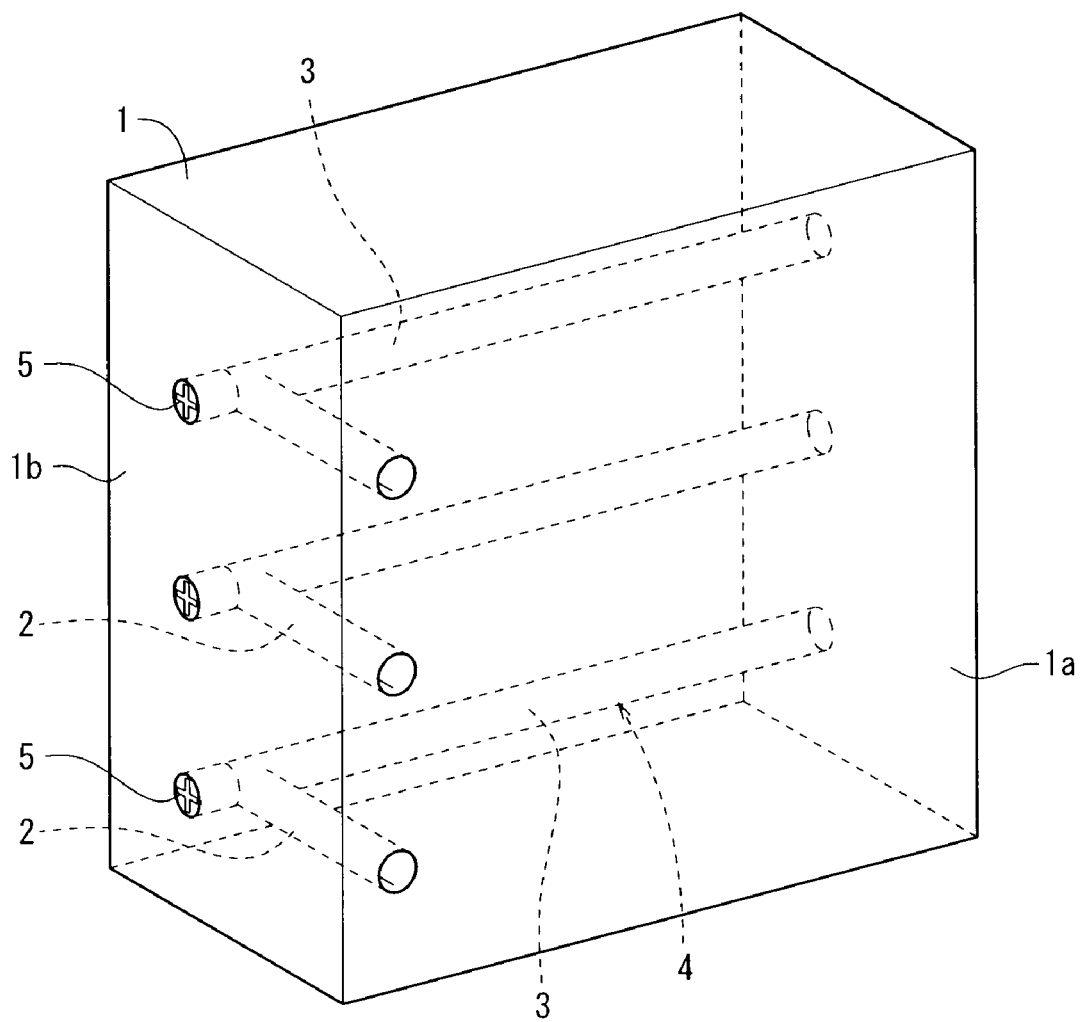
FIG. 16 is an outline explanatory perspective view showing a conventional fluid flow passage structure.

A further embodiment of the invention is shown in FIG. 15. FIG. 15A shows a structure for a solenoid valve manifold. More particularly, in the present embodiment, a pressure fluid supply circuit is constructed for causing a main valve 300 made up from a poppet valve to be moved in the direction of the arrow X shown in FIG. 15B. Reference numeral 302 indicates a first plate, whereas reference numeral 304 shows a second plate. A supply port 305a, a first exhaust port 305b and a second exhaust port 305c are formed in the second plate 304. Wire members 306a to 306d are gripped under pressure between the first plate 302 and the second plate 304, and through holes 308a, 308b, 308c are disposed additionally in the second plate 304. In addition, a passage 310a formed by the first plate 302 and the wires 306a, 306b communicates with the through hole 308a, a passage 310b formed by the first plate 302 and the wires 306b, 306c communicates with the through hole 308b, and a passage 310c formed by the first plate 302 and the wires 306c, 306d communicates with the through hole 308c. Further, in the drawing, reference numerals 320a to 320c indicate respective solenoid-operated valves. The through holes 308a, 308b communicate with the first exhaust port 305b and the second exhaust port 305c, whereas the through hole 308b communicates with the supply port 305a. As can be understood easily and sufficiently from the figures, a manifold can easily be formed by the first plate 302, the second plate 304, and the wires 306a to 306d.

In the above manner, according to the present invention, a fluid flow passage can be formed easily by use of wires. Because wires are used, the formation of long and narrow holes as in the conventional technique is unnecessary, and as a result, this type of fluid pressure device can be made both smaller and lighter in weight. Further, since only wires are used, handling thereof is simplified and fluid flow passages having complex shapes can be formed easily. In addition, the degree of freedom in designing such devices can be enlarged, and the devices can be manufactured at a lower cost.

Although certain preferred embodiments of the present invention have been shown and described in detail, it should be understood that various changes and modifications may be made therein without departing from the scope of the appended claims.

What is claimed is:

1. A fluid flow passage structure comprising:
a first block member;
a second block member;
a wire interposed between the first block member and the second block member,
wherein an airtight or fluidtight hermetic fluid flow passage is formed by at least one of the first and second block members and the wire, and
wherein the first and second block members are mutually positioned by pin members that are interposed between the first and second block members.

2. The fluid flow passage structure according to claim 1, wherein the first and second block members are made from a metal material, or from a light metal or a light metal alloy.

3. The fluid flow passage structure according to claim 2, wherein the light metal or light metal alloy comprises aluminum or an aluminum alloy.

4. The fluid flow passage structure according to claim 1, wherein the wire is made from a metal, or from aluminum or an aluminum alloy.

5. The fluid flow passage structure according to claim 1, wherein the first and second block members are made from stainless steel, and the wire is made from stainless steel.

6. The fluid flow passage structure according to claim 1, wherein the wire is sandwiched and pressed between the first block member and the second block member, and the fluid flow passage is formed between the wire and at least one of the first block member and the second block member.

7. The fluid flow passage structure according to claim 1, wherein one or more intermediate block members are disposed between the first and second block members, and the wire is interposed between the first block member and the intermediate block member, or between the second block member and the intermediate block member, the wire forming a portion of the fluid flow passage.

8. The fluid flow passage structure according to claim 1, wherein another fluid flow passage, which intersects and communicates mutually with the fluid flow passage formed by the wire, is formed in at least one of the first block member and the second block member.

9. The fluid flow passage structure according to claim 1, wherein a metallic or synthetic resin material is filled in a gap formed between the first block member and the second block member, the metallic or synthetic resin material surrounding the wire that forms the fluid flow passage on an outer side thereof.

10. The fluid flow passage structure according to claim 1, wherein a spacer is interposed between the first block member and the second block member, the spacer surrounding the wire that forms the fluid flow passage between the first block member and the second block member.

11. The fluid flow passage structure according to claim 1, wherein the wire is arranged in a predetermined pattern between the first and second block members, such that the airtight or fluidtight fluid hermetic passage is formed in the predetermined pattern by bringing the first and second block members relatively into proximity, and by the first and second block members and the wire.

12. The fluid flow passage structure according to claim 1, wherein, in a state in which either one of the first and second block members or the wire are heated, the first and second block members are pressed together mutually into proximity with each other, thereby forming the fluid flow passage between the wire and at least one of the first and second block members.

13. The fluid flow passage structure according to claim 1, wherein portions of the first and second block members and the wire are mutually melted, and are made integral with each other by means of diffusion bonding or brazing.

14. The fluid flow passage structure according to claim 1, wherein an orifice is formed by the wire between the first and second block members.

15. The fluid flow passage structure according to claim 1, wherein a tank for retaining the fluid therein is formed by the wire between the first and second block members.

16. A method for manufacturing a fluid flow passage structure, comprising:

positioning a wire having a predetermined pattern between a first block member and a second block member;

relatively pressing the first and second block members so as to bring the block members mutually into proximity; and forming a fluid flow passage by the wire between the first and second block members, wherein in the positioning the first and second block members are mutually positioned by pin members that are interposed between the first and second block members.

17. The method for manufacturing a fluid flow passage structure according to claim 16, wherein the first and second block members are mutually positioned, and the first and second block members and the wire are mutually pressed together and made integral.

18. The method for manufacturing a fluid flow passage structure according to claim 16, wherein the first and second block members and the wire are made integral by applied heat pressing, or by diffusion bonding or brazing.

19. The method for manufacturing a fluid flow passage structure according to claim 16, wherein, after the wire is pressed, a filling material is filled in a gap formed between the first and second block members.

* * * * *